(12) United States Patent
Seo

(10) Patent No.: US 11,206,731 B2
(45) Date of Patent: Dec. 21, 2021

(54) COMMUNICATION MODULE

(71) Applicant: Samsung Electro-Mechanics Co., Ltd., Suwon-si (KR)

(72) Inventor: Bo Hyun Seo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/936,766

(22) Filed: Jul. 23, 2020

(65) Prior Publication Data

US 2021/0298166 A1 Sep. 23, 2021

(30) Foreign Application Priority Data

Mar. 17, 2020 (KR) ........................ 10-2020-0032636

(51) Int. Cl.
*H05K 1/02* (2006.01)
*H05K 1/11* (2006.01)
(Continued)

(52) U.S. Cl.
CPC ..... *H05K 1/0224* (2013.01); *H01L 23/49833* (2013.01); *H01L 23/49838* (2013.01);
(Continued)

(58) Field of Classification Search
CPC .......... H05K 1/02; H05K 1/0224; H05K 1/14; H05K 1/141–144; H05K 1/11; H05K 1/111–114; H05K 1/117; H05K 1/18; H05K 1/181–187; H05K 2201/094; H05K 2201/0963; H05K 2201/0919; H05K 2201/0927; H05K 2201/0979;
(Continued)

(56) References Cited

U.S. PATENT DOCUMENTS 6,493,240 B2 * 12/2002 Broglia ................... H05K 1/141
361/736
8,901,718 B2 * 12/2014 Cho ..................... H01L 23/3128
257/660
(Continued)

FOREIGN PATENT DOCUMENTS

| KR | 10-2015-0002264 A | 1/2015 |
|---|---|---|
| KR | 10-2018-0101832 A | 9/2018 |
| KR | 10-1994714 B1 | 7/2019 |

*Primary Examiner* — Tuan T Dinh
(74) *Attorney, Agent, or Firm* — NSIP Law

(57) ABSTRACT

A communication module includes: a substrate; a supplementary substrate disposed to surround an electronic element mounted on a lower surface of the substrate; a molding material configured to seal an electronic element mounted on an upper surface of the substrate; and a shielding layer disposed on a side surface and an upper surface of the molding material, a side surface of the supplementary substrate, and a side surface of the substrate. The supplementary substrate includes: a plurality of first pads disposed on an upper surface of the supplementary substrate; a plurality of second pads disposed on a lower surface of the supplementary substrate; a plurality of vias connecting the plurality first pads to the plurality of second pads; and a ground pad disposed on the side surface of the supplementary substrate. The ground pad includes an extender connected to a corresponding first pad and a corresponding second pad.

13 Claims, 10 Drawing Sheets

(51) Int. Cl.
*H01L 23/552* (2006.01)
*H01L 23/498* (2006.01)
*H05K 1/18* (2006.01)
*H05K 1/14* (2006.01)

(52) U.S. Cl.
CPC ............ *H01L 23/552* (2013.01); *H05K 1/113* (2013.01); *H05K 1/117* (2013.01); *H05K 1/144* (2013.01); *H05K 1/181* (2013.01); H05K 2201/0715 (2013.01); H05K 2201/094 (2013.01); H05K 2201/0919 (2013.01); H05K 2201/09027 (2013.01); H05K 2201/09063 (2013.01); H05K 2201/0979 (2013.01); H05K 2201/10545 (2013.01)

(58) Field of Classification Search
CPC .......... H05K 2201/10545; H01L 23/48; H01L 23/552; H01L 21/82
USPC ......... 361/770–790, 816, 818; 174/250–252, 174/350, 520; 257/659–690, 730–734, 257/787–790
See application file for complete search history.

(56) References Cited

U.S. PATENT DOCUMENTS

| | | | |
|---|---|---|---|
| 9,510,461 B2* | 11/2016 | Lee | .......................... H01L 24/97 |
| 9,620,484 B2* | 4/2017 | Kim | ..................... H01L 25/0657 |
| 2001/0054758 A1* | 12/2001 | Isaak | ...................... H05K 1/141 |
| | | | 257/686 |
| 2011/0248389 A1* | 10/2011 | Yorita | ................. H01L 25/0652 |
| | | | 257/659 |
| 2012/0243195 A1* | 9/2012 | Lim | ........................ H05K 1/141 |
| | | | 361/784 |
| 2013/0127025 A1* | 5/2013 | Cho | ....................... H01L 23/552 |
| | | | 257/660 |
| 2015/0001690 A1 | 1/2015 | Nam | |
| 2015/0061095 A1* | 3/2015 | Choi | ........................ H01L 25/50 |
| | | | 257/675 |
| 2016/0204073 A1* | 7/2016 | Beak | ...................... H01L 23/291 |
| | | | 455/418 |

* cited by examiner

COMMUNICATION MODULE

CROSS-REFERENCE TO RELATED APPLICATIONS

This application claims the benefit under 35 U.S.C. § 119(a) of Korean Patent Application No. 10-2020-0032636 filed on Mar. 17, 2020, in the Korean Intellectual Property Office, the entire disclosure of which is incorporated herein by reference for all purposes.

BACKGROUND

1. Field

The following description relates to a communication module.

2. Description of Related Art

Recently, a communication module having a double-sided mounting structure has been adopted. In comparison to a conventional single-sided communication module, a surface structure of a double-sided communication module is effectively reduced, and the double-sided mounting structure is a solution for a special restriction in designing of various mobile devices.

The double-sided mounting structure has several disadvantageous in that the structure has to have a height greater than that of the single-sided module. However, the double-sided mounting structure requires high manufacturing costs to make the structure as thin as possible while reducing heights of components. Further, shielding layers are formed in a sputtering method for electromagnetic shielding, and a method of contacting the shielding layer and a ground layer provided in an inner layer of a substrate is applied, which is problematic due to a difficult manufacturing processes. Further, the double-sided mounting structure is significantly vulnerable to heat dissipation, in comparison to the single-sided module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a communication module includes: a substrate; electronic elements mounted on the substrate; a supplementary substrate disposed to surround an electronic element, among the electronic elements, mounted on a lower surface of the substrate; a molding material configured to seal an electronic element, among the electronic elements mounted on an upper surface of the substrate; and a shielding layer disposed on a side surface and an upper surface of the molding material, a side surface of the supplementary substrate, and a side surface of the substrate. The supplementary substrate includes: a plurality of first pads disposed on an upper surface of the supplementary substrate; a plurality of second pads disposed on a lower surface of the supplementary substrate; a plurality of vias partially connecting the plurality first pads to the plurality of second pads; and a ground pad disposed on the side surface of the supplementary substrate. The ground pad includes an extender connected to a corresponding first pad, among the plurality of first pads, and a corresponding second pad, among the plurality of second pads.

The ground pad may include a plurality of ground pads spaced apart from each other on the side surface of the supplementary substrate.

The shielding layer may be connected to the ground pad.

The supplementary substrate may further include a through hole in which the electronic element is disposed.

A wiring layer including a plurality of layers may be disposed in the substrate. The wiring layer may include a ground layer connected to the shielding layer.

The plurality of first pads and the plurality of second pads may each be disposed in at least two rows. The corresponding first pad and the corresponding second pad may be disposed on an outermost side of the supplementary substrate.

The substrate may have a tetragonal plate shape. The supplementary substrate may have a tetragonal band shape.

Each of the plurality of first pads may have a circular plate shape, and each of the plurality of second pads may have a tetragonal plate shape.

The plurality of electronic elements may include an element for communication.

In another general aspect, a communication module includes: a substrate having a tetragonal plate shape; electronic elements mounted on the substrate; a supplementary substrate disposed to surround an electronic element, among the electronic elements, mounted on a lower surface of the substrate; a molding material configured to seal an electronic element, among the electronic elements, mounted on an upper surface of the substrate; and a shielding layer disposed to surround the molding material, and disposed on a side surface of the supplementary substrate and a side surface of the substrate. The supplementary substrate includes: a plurality of first pads disposed on an upper surface of the supplementary substrate and disposed in at least two first rows; a plurality of second pads disposed on a lower surface of the supplementary substrate and disposed in at least two second rows; a plurality of vias connecting the plurality of first pads to the plurality of second pads; and a ground pad disposed on the side surface of the supplementary substrate, and connected to a corresponding first pad, among the plurality of first pads, and a corresponding second pad, among the plurality of second pads. The corresponding first pad is included in a row, among the at least two first rows, on an outermost side of the substrate, and the corresponding second pad is included in a row, among the least two second rows, on the outermost side of the substrate.

The ground pad may include: a first extender portion disposed on the upper surface of the supplementary substrate and connected to the corresponding first pad; and a second extender portion disposed on the lower surface of the supplementary substrate and connected to the corresponding second pad.

A portion of the ground pad disposed on the side surface of the supplementary substrate may be in contact with the shielding layer.

The supplementary substrate may be disposed in a band shape on an edge region of the lower surface of the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
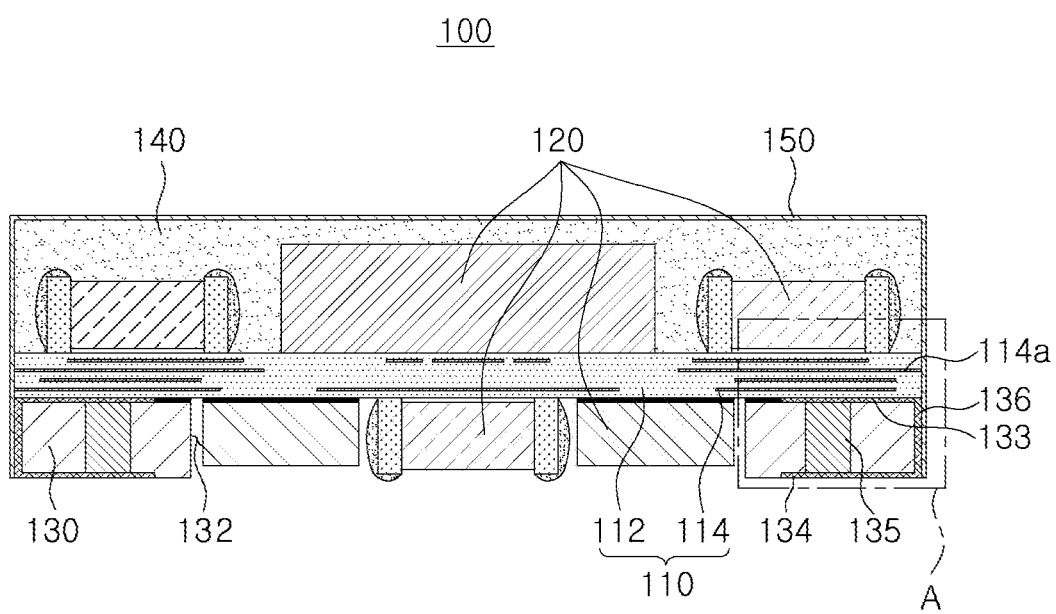
FIG. 1 is a cross-sectional diagram schematically illustrating a communication module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
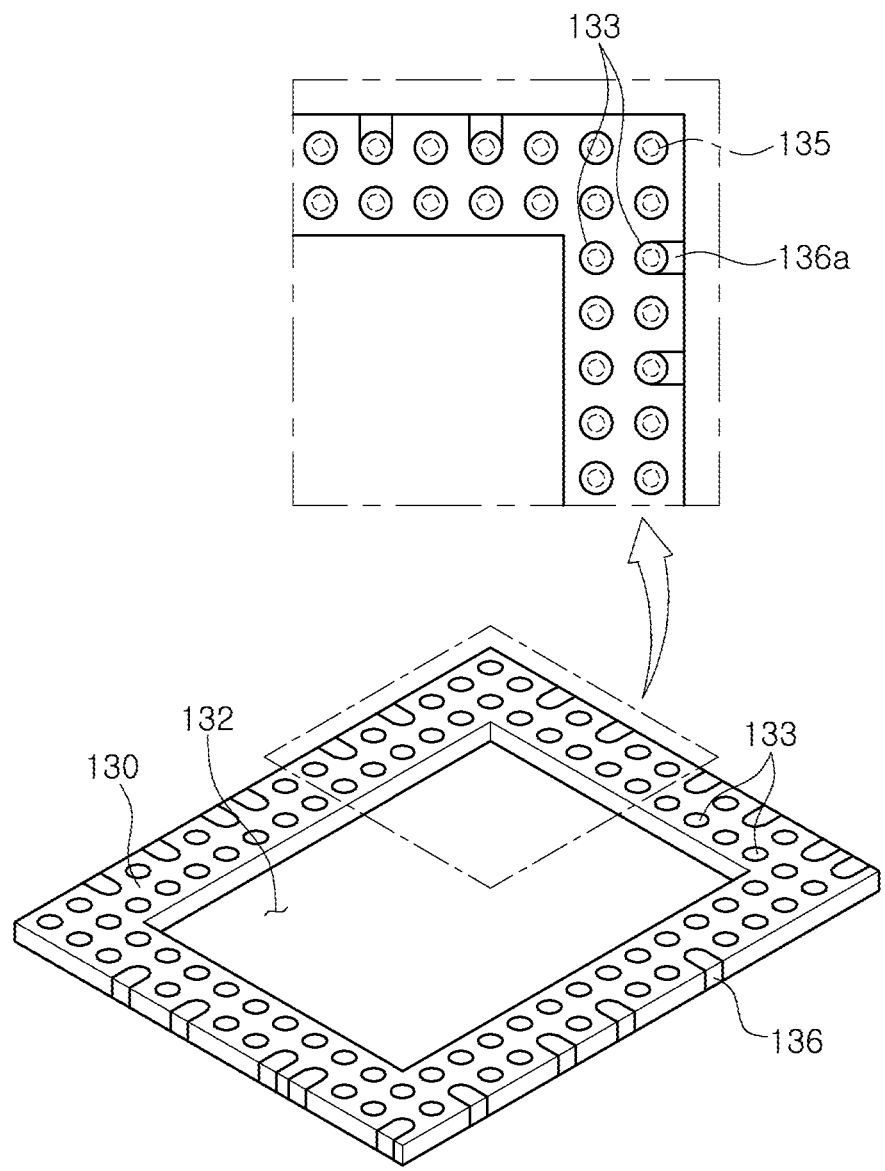
FIG. 2 is a perspective view of a supplementary substrate of the communication module of FIG. 1, according to an embodiment.
Figure 3:
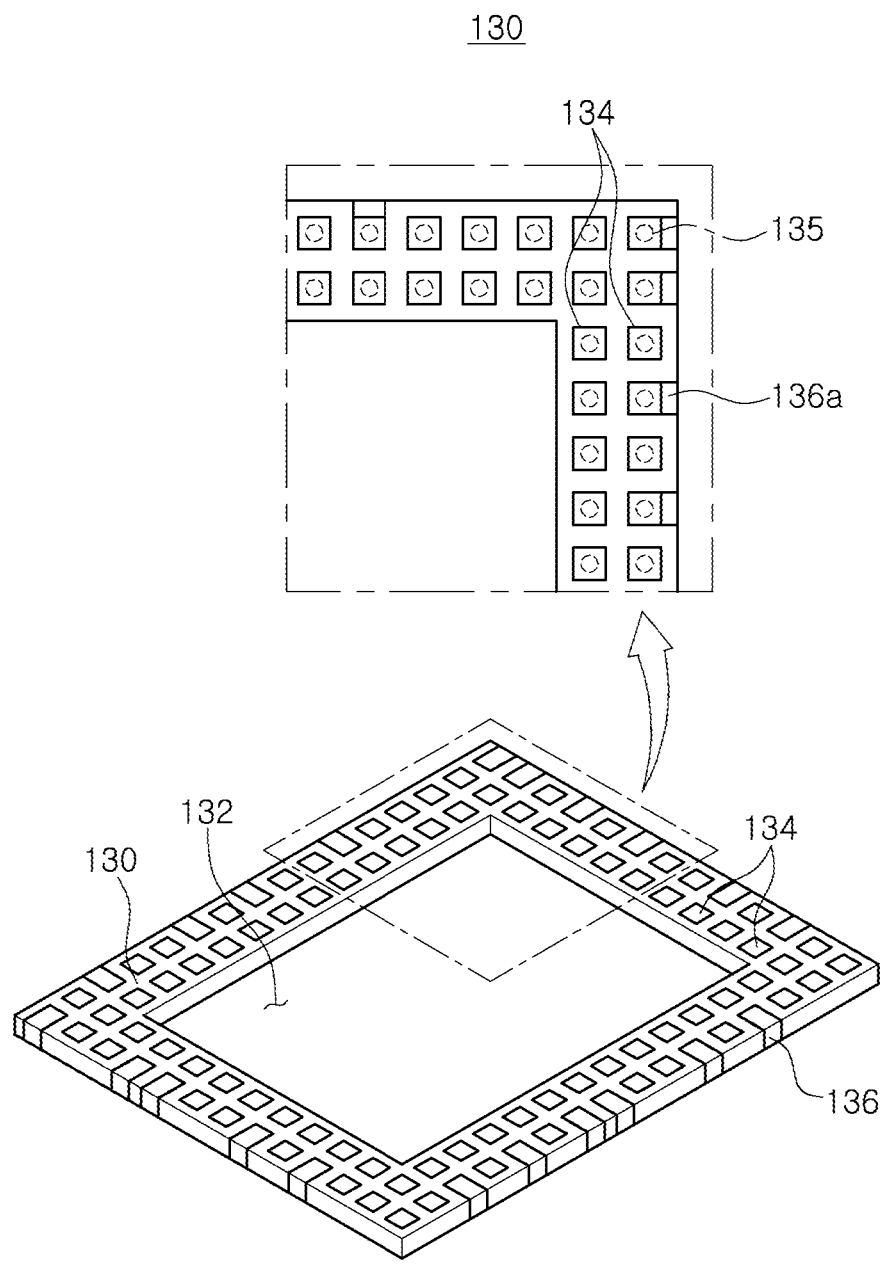
FIG. 3 is a perspective bottom view of the supplementary substrate of the communication module of FIG. 1, according to an embodiment.
Figure 4:
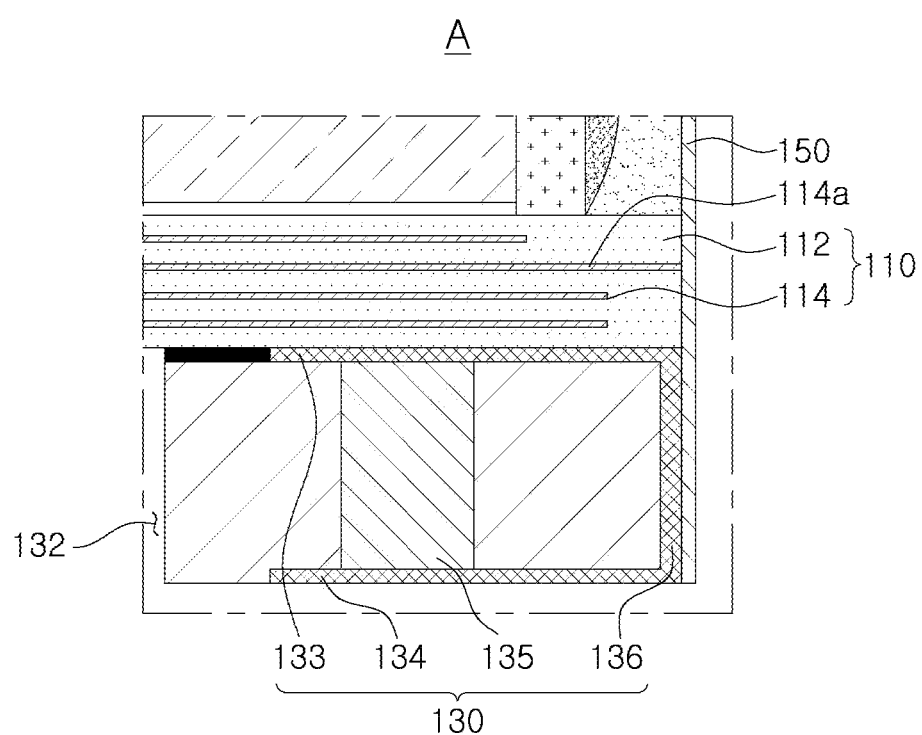
FIG. 4 is an enlarged view of "A" of FIG. 1.

FIG. 1 is a cross-sectional diagram schematically illustrating a communication module 100, according to an embodiment. FIG. 2 is a perspective view of a supplementary substrate 130 of the communication module 100, according to an embodiment. FIG. 3 is a perspective bottom view of the supplementary substrate 130, according to an embodiment, and FIG. 4 is an enlarged view of "A" of FIG. 1.

Based on FIGS. 1 to 4, the communication module 100 may include, for example, a substrate 110, electronic elements 120, a supplementary substrate 130, a molding material 140 and a shielding layer 150.

The substrate 110 may be a multilayer substrate formed of several insulating layers 112 and several wiring layers 114 repeatedly stacked. For example, the substrate 110 may have a tetragonal plate shape. The substrate 110 may be a double-sided substrate. For example, various substrates well known in the art (for example, a printed circuit board, a flexible substrate, a ceramic substrate, a glass substrate, or the like) may be used as the substrate 110.

A material of the insulating layer 112 is not particularly limited. For example, a thermosetting resin such as an epoxy resin, a thermoplastic resin such as polyimide, or a resin in which the thermosetting or thermoplastic resin is impregnated with an inorganic filler in a core material such as a glass fiber (or a glass cloth or a glass fabric), or the like, for example, an insulating material such as prepreg, Ajinomoto Build-up Film (ABF), FR-3, and Bismaleimide Triazine (BT), may be used to form the insulating layer 112.

The wiring layer 114 may be electrically connected to the electronic elements 120, which are described below. A conductive material, such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, and Ti, or the like, may be used as a material of the wiring layer 114.

The wiring layer 114 may include a ground layer 114a connected to the shielding layer 150.

In addition, an insulation protecting layer (not illustrated) may be disposed on a surface of the substrate 110. The insulation protecting layer may be formed of a solder resist and may be disposed on upper and lower surfaces of the insulating layer 112 in a form covering both the insulating layer 112 and the wiring layer 114.

The substrate 110 includes a first surface (e.g., upper surface) and a second surface (e.g., lower surface) opposite to the first surface. The supplementary substrate 130 is mounted on an edge of the second surface.

Further, one or more electrodes for mounting the electronic elements 120 (not illustrated) may be disposed on the first and second surfaces of the substrate 110.

The electronic elements 120 are disposed on the first and second surfaces of the substrate 110. The electronic element 120 may include one or more of various elements, such as an active element and a passive element. That is, the electronic elements 120 may include any electronic elements or members that can be mounted on the substrate 110.

Further, the electronic element 120 may include an element that needs to be protected from an electromagnetic wave introduced from outside or released during operation of the communication module 100.

The electronic element 120 may include, for example, an element for communication.

The supplementary substrate 130 may be disposed along or near an edge (e.g., on an edge region) of the second surface of the substrate 110. That is, the supplementary substrate 130 may be disposed along a perimeter region of the second surface of the substrate 110. As an example, the supplementary substrate 130 may have a tetragonal band shape and may include a through hole 132 in which a plurality of the electronic elements 120 are disposed. A first pad 133 may be disposed on one surface of the supplementary substrate 130 that is disposed on the second surface of the substrate 110, while a second pad 134 may be disposed on another surface of the supplementary substrate 130 opposite to the one surface. As an example, the first pad 133 may have a circular plate shape while the second pad 134 may have a tetragonal plate shape. However, the first and second pads 133 and 134 are not limited to the described shapes. The first and second pads 133 and 134 may have various shapes.

The first and second pads 133 and 134 may each be disposed in at least two rows.

At least a portion of the first and second pads 133 and 134 may be connected to each other through a via 135. That is, one or more first pads 133 may be respectively connected to one or more corresponding second pads 134 by one or more corresponding vias 135. Further, a ground pad 136 connected to the shielding layer 150 may be disposed on a side surface of the supplementary substrate 130. As an example, the ground pad 136 may include an extender 136a (see FIGS. 2 and 3) formed to extend on the one surface and the other surface of the supplementary substrate 130. That is, a portion of the ground pad 136 may be connected to corresponding first and second pads 133 and 134 disposed on an outermost side or row, among a plurality of the first and second pads 133 and 134, and the extender 136a may extend from the corresponding first and second pads 133 and 134. A plurality of ground pads 136 may be spaced apart from each other on the side surface of the supplementary substrate 130.

The molding material 140 is configured to seal the electronic element 120 mounted on the first surface of the substrate 110. The molding material 140 safely protects the electronic element 120 mounted on the first surface of the substrate 110 from an external impact by surrounding the electronic element 120 mounted on the first surface of the substrate 110 and fixing in the electronic element 120 mounted on the first surface of the substrate 110 in place.

The molding material 140 may be formed of an insulating material. For example, the molding material 140 may be formed of a resin material, such as an epoxy molding compound (EMC), but is not limited thereto. Further, if necessary, the molding material 140 may be formed of a conductive material (for example, a conductive resin, or the like). In this case, an additional molding material, such as an underfill resin, may be provided between the electronic element 120 and the substrate 110.

The shielding layer 150 is disposed to cover side surfaces of the supplementary substrate 130 and the substrate and the upper and side surfaces of the molding material 140. The shielding layer 150 is configured to shield an electromagnetic wave introduced toward the electronic element 120 mounted on the first surface of the substrate 110 and externally released from the electronic element 120 mounted on the first surface of the substrate 110. Accordingly, the shielding layer 150 is formed of a conductive material and is connected to the ground pad 136 of the supplementary substrate 130 and the ground layer 114a of the substrate 110.

The shielding layer 150 may be prepared by forming a thin film or applying a resin material containing a conductive powder to an external surface of the molding material 140. Various technologies, such as sputtering, screen printing, vapor deposition, electrolytic plating, electroless plating, and the like, may be employed to form the thin film.

For example, the shielding layer 150 may be a metal thin film formed on an external surface of the molding material 140 by a spray coating method. The spray coating method may result in formation of a uniform application layer and has an advantage of a reduced cost in designing investment as compared to the other methods. However, the shielding layer 150 is not limited to being formed by a spray coating method. A metal thin film may be formed by the sputtering method.

The shielding layer 150 additionally prevents detachment of the molding material 140 from the electronic component 120 and the substrate 110.

As previously described, the shielding layer 150 is connected to the ground pad 136 of the supplementary substrate 130 and may thus improve shielding performance due to an increased contact surface of the ground. Further, heat dissipation performance may be improved by the ground pad 136.

Figure 5:
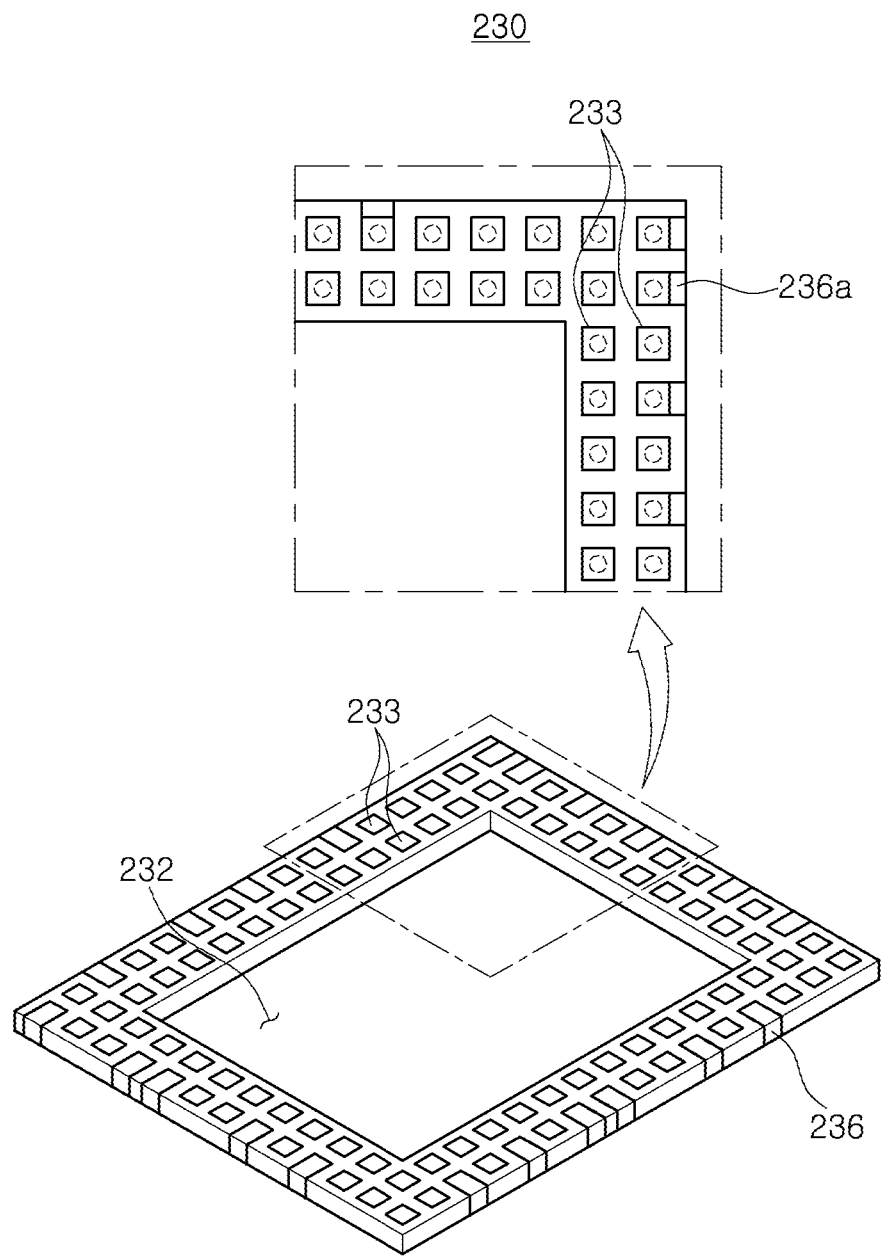
FIG. 5 is a perspective view of a supplementary substrate, according to an embodiment.
Figure 6:
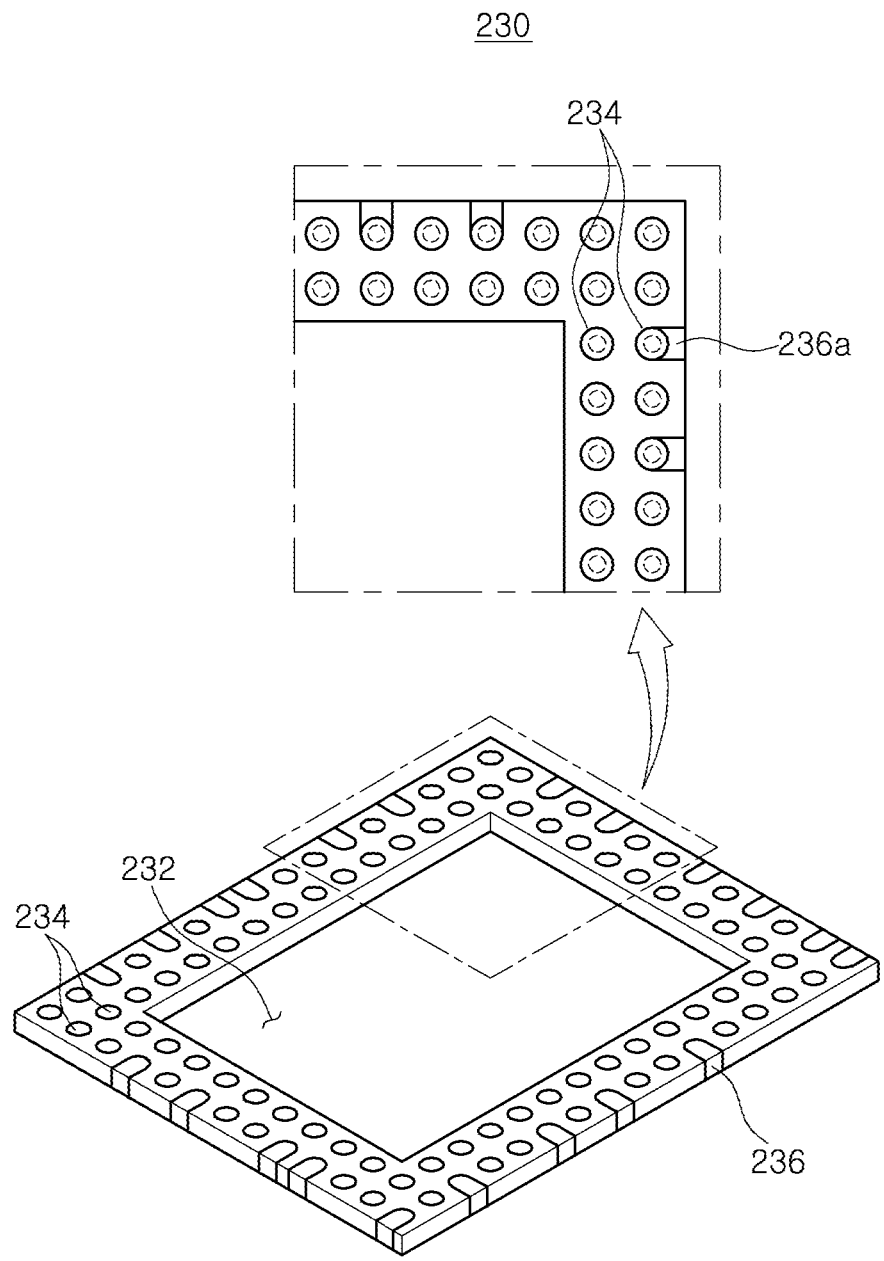
FIG. 6 is a perspective bottom view of the supplementary substrate of FIG. 5, according to an embodiment.

FIG. 5 is a perspective view of a supplementary substrate 230, according to an embodiment. FIG. 6 is a perspective bottom view of the supplementary substrate 230, according to an embodiment.

Referring to FIGS. 5 and 6, the supplementary substrate 230 may be disposed along or near an edge (e.g., on an edge region) of a second surface of the substrate 110 (see FIG. 1). That is, the supplementary substrate 230 may be disposed along a perimeter region of the second surface of the substrate 110, and may have a tetragonal band shape. As an example, the supplementary substrate 230 may include a through hole 232 in which a plurality of the electronic elements 120 (see FIG. 1) are disposed. Further, a plurality of first pads 233 are disposed on one surface of the supplementary substrate 230 while a plurality of second pads 234 are disposed on the other surface of the supplementary substrate 230. As an example, the first pads 233 may have a circular plate shape while the second pads 234 may have a tetragonal plate shape, but the first and second pads 233 and 234 are not limited to the described shapes. The first and second pads 233 and 234 may have various shapes.

The first and second pads 233 and 234 may each be disposed in at least two rows.

At least a portion of the first and second pads 233 and 234 may be connected to each other through a via 235. That is, one or more first pads 233 may be respectively connected to one or more corresponding second pads 234 by one or more corresponding vias 235. Further, a ground pad 236 connected to the shielding layer 150 (see FIG. 1) may be disposed on a side surface of the supplementary substrate 230. As an example, the ground pad 236 may include an extender 236a formed to extend on the one surface and the other surface of the supplementary substrate 230. That is, a portion of the ground pad 236 may be connected to corresponding first and second pads 233 and 234 disposed on an outermost side or row, among the plurality of the first and second pads 233 and 234, and the extender 236a may extend from the corresponding first and second pads 233 and 234. A plurality of ground pads 236 may be spaced apart from each other on the side surface of the supplementary substrate 230.

Figure 7:
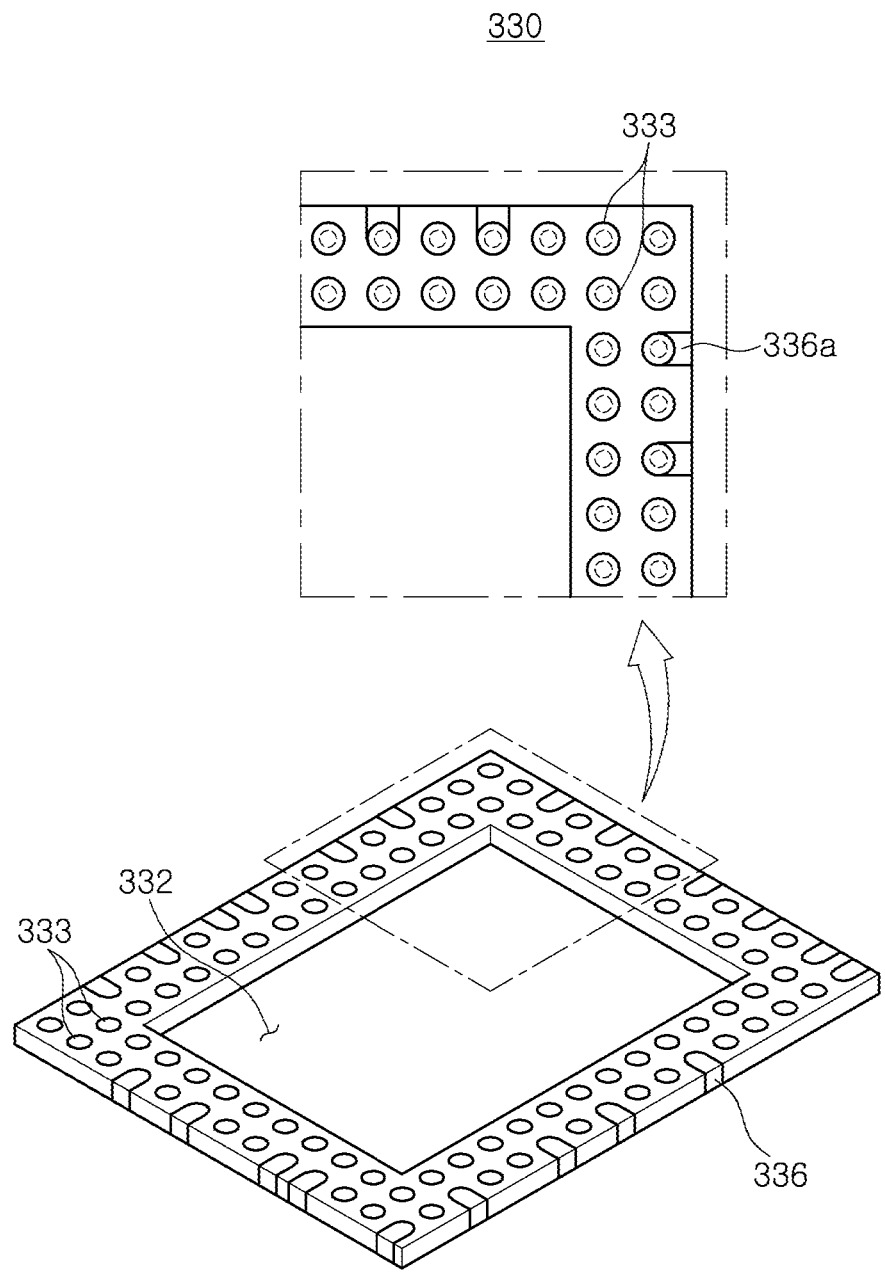
FIG. 7 is a perspective view of a supplementary substrate, according to an embodiment.
Figure 8:
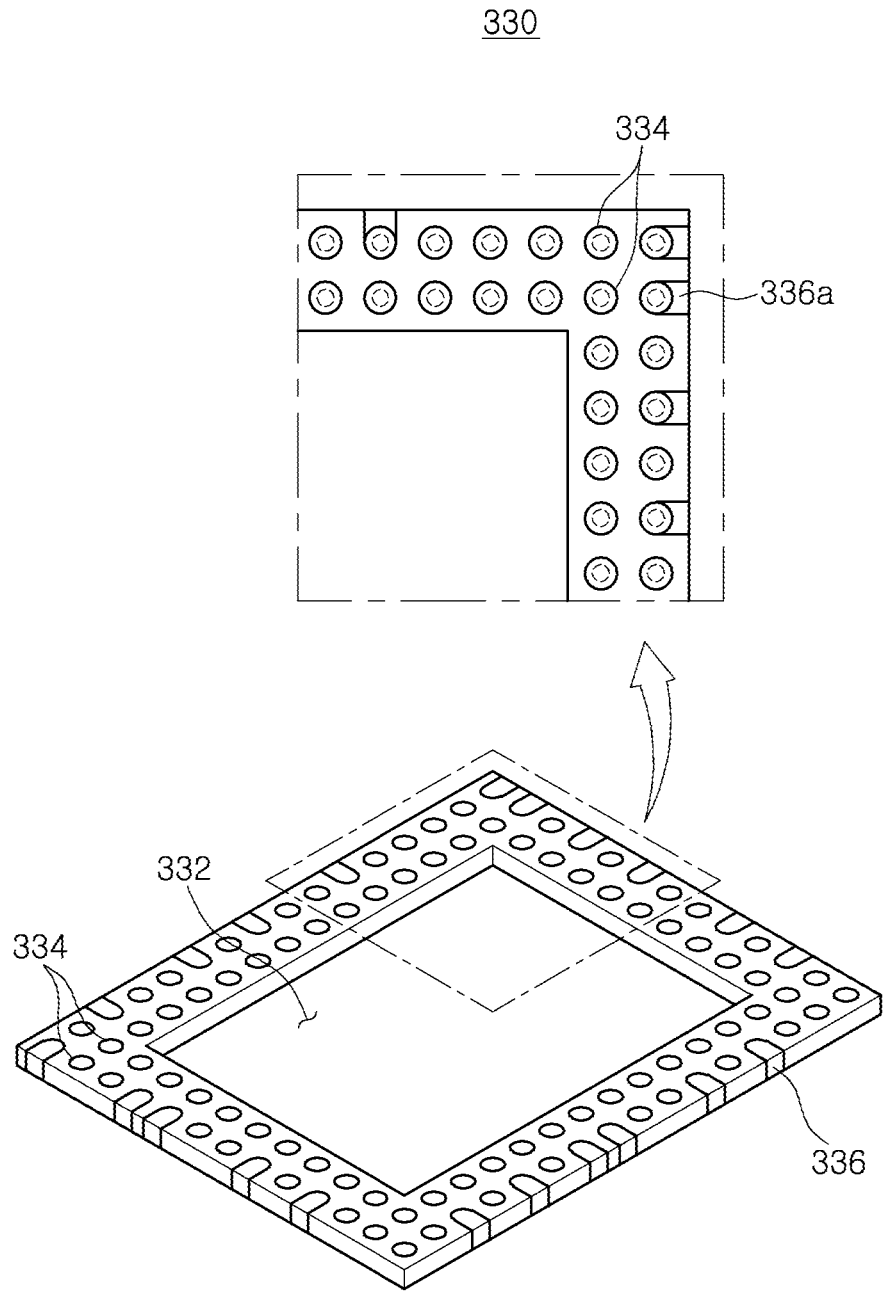
FIG. 8 is a perspective bottom view of the supplementary substrate of FIG. 7, according to an embodiment.

FIG. 7 is a perspective view of a supplementary substrate 330, according to an embodiment. FIG. 8 is a perspective bottom view of the supplementary substrate 330, according to an embodiment.

Referring to FIGS. 7 and 8, the supplementary substrate 330 may be disposed along or near an edge (e.g., on an edge region) of a second surface of the substrate 110 (see FIG. 1), and may have a tetragonal band shape. That is, the supplementary substrate 330 may be disposed along a perimeter region of the second surface of the substrate 110. As an example, the supplementary substrate 330 may include a through hole 332 in which a plurality of the electronic elements 120 (see FIG. 1) are disposed. Further, a plurality of first pads 333 are disposed on one surface of the supplementary substrate 330 while a plurality of second pads 334 are disposed on the other surface of the supplementary substrate 330. As an example, the first pads 333 may have a circular plate shape while the second pads 334 may have a circular plate shape, but the first and second pads 333 and 334 are not limited to the described shapes. The first and second pads 333 and 334 may have various shapes. Since the first and second pads 333 and 334 may have the same shape, the supplementary substrate 330 can be implemented without distinguishing the upper and lower surfaces of the supplementary substrate 330.

The first and second pads 333 and 334 may each be disposed in at least two rows.

At least a portion of the first and second pads 333 and 334 may be connected to each other through a via 335. That is, one or more first pads 333 may be respectively connected to one or more corresponding second pads 334 by one or more corresponding vias 335. Further, a ground pad 336 connected to the shielding layer 150 (see FIG. 1) may be disposed on a side surface of the supplementary substrate 330. As an example, the ground pad 336 may include an extender 336a formed to extend on the one surface and the other surface of the supplementary substrate 330. That is, a portion of the ground pad 336 may be connected to corresponding first and second pads 333 and 334 disposed on an outermost side or row, among the plurality of the first and second pads 333 and 334, and the extender 336a may extend from the corresponding first and second pads 333 and 334. A plurality of ground pads 336 may be spaced apart from each other on the side surface of the supplementary substrate 330.

Figure 9:
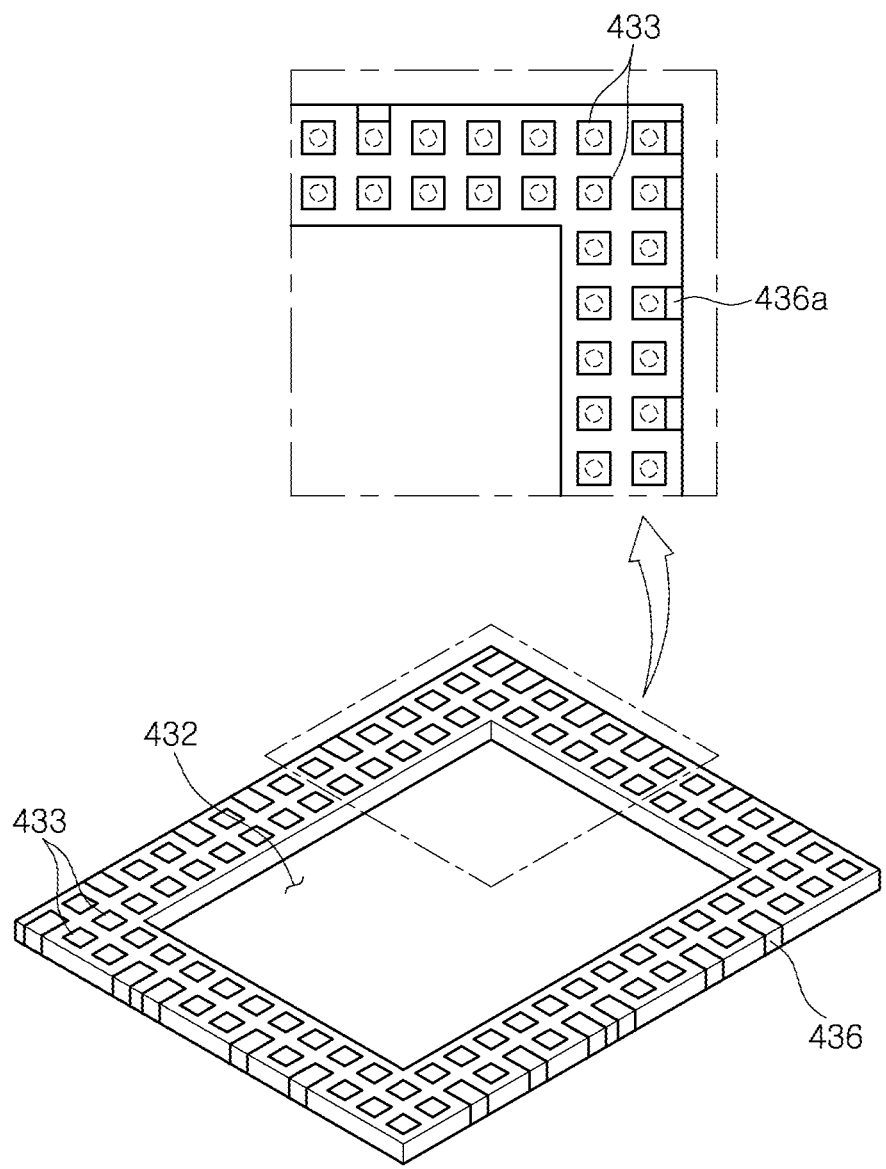
FIG. 9 is a perspective view of a supplementary substrate, according to an embodiment.
Figure 10:
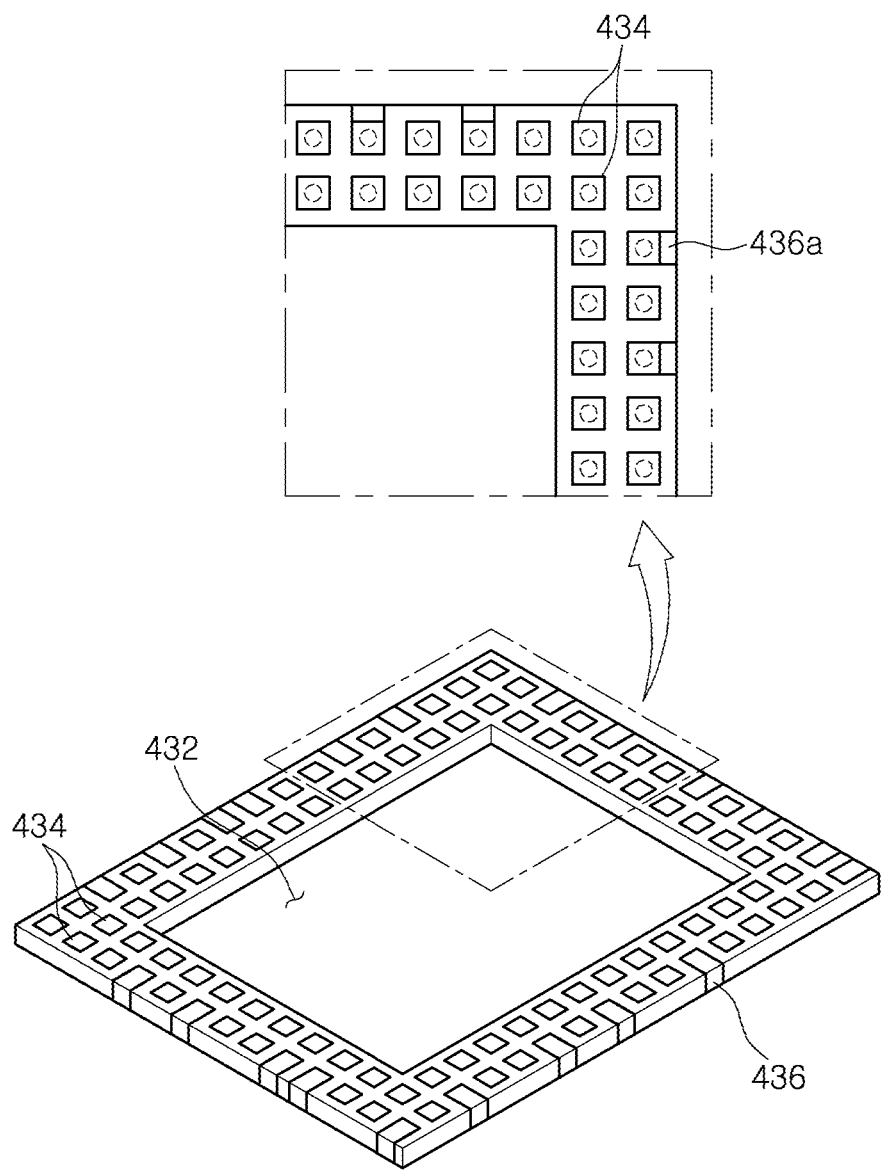
FIG. 10 is a perspective bottom view of the supplementary substrate of FIG. 9, according to an embodiment.

FIG. 9 is a perspective view of a supplementary substrate 430, according to an embodiment. FIG. 10 is a perspective bottom view of the supplementary substrate 430, according to an embodiment.

Referring to FIGS. 9 and 10, the supplementary substrate 430 may be disposed along or near an edge (e.g., on an edge region) of a second surface of the substrate 110 (see FIG. 1). That is, the supplementary substrate 430 may be disposed along a perimeter region of the second surface of the substrate 110, and may have a tetragonal band shape. As an example, the supplementary substrate 430 may include a through hole 432 in which a plurality of the electronic elements 120 (see FIG. 1) are disposed. Further, a plurality of first pads 433 are disposed on one surface of the supplementary substrate 430 while a plurality of second pads 434 are disposed on the other surface of the supplementary substrate 430. As an example, the first pads 433 may have a tetragonal plate shape while the second pads 434 may have a tetragonal plate shape, but the first and second plates 433 and 434 are not limited to the described shapes. Since first and second pads 433 and 434 may have the same shape, the supplementary substrate 430 can be implemented without distinguishing the upper and lower surfaces of the supplementary substrate 430.

The first and second pads 433 and 434 may each be disposed in at least two rows.

Meanwhile, at least a portion of the first and second pads 433 and 434 may be connected to each other through a via 435. That is, one or more first pads 433 may be respectively connected to one or more corresponding second pads 434 by one or more corresponding vias 435. Further, a ground pad 436 connected to the shielding layer 150 (see FIG. 1) may be disposed on a side surface of the supplementary substrate 430. As an example, the ground pad 436 may include an extender 436a formed to extend on the one surface and the other surface of the supplementary substrate 430. That is, a portion of the ground pad 436 may be connected to corresponding first and second pads 433 and 434 disposed on an outermost side or row, among the plurality of the first and second pads 433 and 434, and the extender 436*a* may extend from the corresponding first and second pads 433 and 434. A plurality of ground pads 436 may be spaced apart from each other on the side surface of the supplementary substrate 430.

According to embodiments disclosed herein, shielding efficiency and heat dissipation performance may be improved in a communication module having a double-sided mounting structure.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A communication module, comprising:
   a substrate;
   a wiring layer disposed in the substrate, and comprising a plurality of layers;
   electronic elements mounted on the substrate;
   a supplementary substrate disposed to surround first electronic element, among the electronic elements, mounted on a lower surface of the substrate;
   a molding material configured to seal a second electronic element, among the electronic elements, mounted on an upper surface of the substrate; and
   a shielding layer disposed on a side surface and an upper surface of the molding material, a side surface of the supplementary substrate, and a side surface of the substrate,
   wherein the supplementary substrate comprises:
      a plurality of first pads disposed on an upper surface of the supplementary substrate;
      a plurality of second pads disposed on a lower surface of the supplementary substrate;
      a plurality of vias connecting the plurality first pads to the plurality of second pads; and
      a ground pad disposed on the side surface of the supplementary substrate,
   wherein the ground pad includes an extender connected to a corresponding first pad, among the plurality of first pads, and a corresponding second pad, among the plurality of second pads, and
   wherein the wiring layer includes a ground layer directly connected to the shielding layer.

2. The communication module of claim 1, the ground pad comprises a plurality of ground pads spaced apart from each other on the side surface of the supplementary substrate.

3. The communication module of claim 1, wherein the shielding layer is connected to the ground pad.

4. The communication module of claim 1, wherein the supplementary substrate further comprises a through hole in which the first electronic element is disposed.

5. The communication module of claim 1, wherein the plurality of first pads and the plurality of second pads are each disposed in at least two rows, and
   wherein the corresponding first pad and the corresponding second pad are disposed on an outermost side of the supplementary substrate.

6. The communication module of claim 5, wherein the substrate has a tetragonal plate shape, and the supplementary substrate has a tetragonal band shape.

7. The communication module of claim 5, wherein each of the plurality of first pads has a circular plate shape, and each of the plurality of second pads has a tetragonal plate shape.

8. The communication module of claim 5, wherein the electronic elements comprise an element for communication.

9. A communication module, comprising:
   a substrate having a tetragonal plate shape;
   a wiring layer disposed in the substrate, and comprising a plurality of layers;
   electronic elements mounted on the substrate;
   a supplementary substrate disposed to surround a first electronic element, among the electronic elements, mounted on a lower surface of the substrate;
   a molding material configured to seal a second electronic element, among the electronic elements, mounted on an upper surface of the substrate; and
   a shielding layer disposed to surround the molding material, and disposed on a side surface of the supplementary substrate and a side surface of the substrate,
   wherein the supplementary substrate comprises:
      a plurality of first pads disposed on an upper surface of the supplementary substrate and disposed in at least two first rows;
      a plurality of second pads disposed on a lower surface of the supplementary substrate and disposed in at least two second rows;
      a plurality of vias connecting the plurality of first pads to the plurality of second pads; and
      a ground pad disposed on the side surface of the supplementary substrate, and connected to a corresponding first pad, among the plurality of first pads, and a corresponding second pad, among the plurality of second pads,
   wherein the corresponding first pad is included in a row, among the at least two first rows, on an outermost side of the substrate, and the corresponding second pad is included in a row, among the least two second rows, on the outermost side of the substrate, and
   wherein the wiring layer includes a ground layer directly connected to the shielding layer.

10. The communication module of claim 9, wherein the ground pad comprises:
   a first extender portion disposed on the upper surface of the supplementary substrate and connected to the corresponding first pad; and
   a second extender portion disposed on the lower surface of the supplementary substrate and connected to the corresponding second pad.

11. The communication module of claim 9, wherein the supplementary substrate is disposed in a band shape on an edge region of the lower surface of the substrate.

12. The communication module of claim 10, wherein a portion of the ground pad disposed on the side surface of the supplementary substrate is in contact with the shielding layer.

13. A communication module, comprising:
a substrate;
electronic elements mounted on the substrate;
a supplementary substrate disposed to surround a first electronic element, among the electronic elements, mounted on a lower surface of the substrate;
a molding material configured to seal a second electronic element, among the electronic elements, mounted on an upper surface of the substrate; and
a shielding layer disposed on a side surface and an upper surface of the molding material, a side surface of the supplementary substrate, and a side surface of the substrate,
wherein the supplementary substrate comprises:
  a plurality of first pads disposed on an upper surface of the supplementary substrate;
  a plurality of second pads disposed on a lower surface of the supplementary substrate;
  a plurality of vias connecting the plurality first pads to the plurality of second pads; and
  a ground pad disposed on the side surface of the supplementary substrate, and
wherein the ground pad includes an extender directly connected to a corresponding first pad, among the plurality of first pads, and a corresponding second pad, among the plurality of second pads.

* * * * *